United States Patent [19]
Chao

[11] Patent Number: 5,614,434
[45] Date of Patent: Mar. 25, 1997

[54] METHOD FOR MINIMIZING THE ENCROACHMENT EFFECT OF FIELD ISOLATION STRUCTURE

[75] Inventor: Fang-Ching Chao, Hsinchu, Taiwan

[73] Assignee: United Microelectronics Corp., Hsinchu, Taiwan

[21] Appl. No.: 593,486

[22] Filed: Jan. 29, 1996

[51] Int. Cl.$^6$ .................................................. H01L 21/76
[52] U.S. Cl. ............................ 437/70; 437/69; 437/978
[58] Field of Search .............................. 437/69, 70, 72, 437/73, 978

[56] References Cited

U.S. PATENT DOCUMENTS

| | | | |
|---|---|---|---|
| 4,829,019 | 5/1989 | Mitchell et al. | 437/69 |
| 5,104,829 | 4/1992 | Shida | 437/70 |
| 5,208,181 | 5/1993 | Chi | 437/70 |
| 5,286,672 | 2/1994 | Hodges et al. | 437/70 |

Primary Examiner—Trung Dang
Attorney, Agent, or Firm—Christensen, O'Connor, Johnson & Kindness, pllc

[57] ABSTRACT

A method for minimizing the impurity encroachment effect of field isolation structures for NMOS, PMOS and CMOS integrated circuits is disclosed. In the process, a sacrificial layer is deposited on a laminate comprising a substrate having thereon stacked layers. A photo-resist mask which defines the active regions is then formed on the top of the sacrificial layer and an anisotropic etching is used to remove the unmasked sacrificial layer and the stacked layers. A portion of the photo-resist is eroded, and the exposed sacrificial layer is removed. After the photo-resist is removed, channel-stop ions are implanted, and the portion of the stacked layers not covered by the sacrificial layer are etched. After the sacrificial layer is completely removed, isolation regions are formed on the exposed substrate. The channel-stop region is self-aligned to the resulting field oxide and the isolation structure is free of impurity encroachment effect.

37 Claims, 13 Drawing Sheets

METHOD FOR MINIMIZING THE ENCROACHMENT EFFECT OF FIELD ISOLATION STRUCTURE

BACKGROUND OF THE INVENTION

1. Field of the Invention

The present invention relates to a method for forming the isolation regions among devices on a semiconductor substrate, and more particularly to a method for forming the field isolation structure without the impurity encroachment effect.

2. Description of the Prior Art

The art of the isolation among devices, which are built on a semiconductor substrate, becomes one important aspect of modem metal-oxide-semiconductor (MOS) and bipolar integrated circuit technology as many as hundreds of thousands of devices are used in a single chip. Improper isolation among transistors will cause current leakages, which can consume significant power for the entire chip and can further escalate latchup to damage the circuit function momentarily or permanently, and will result in noise margin degradation, voltage shift or crosstalk. For the widespread use of complementary MOS (CMOS) technology in modem very large scale integration (VLSI) industry, the adequate isolation provided among opposite-type transistors is important as well as that among same-type transistors.

In MOS technology, isolation is usually practiced by ion-doping, often referred to as channel stop, of polarity opposite to the source electrode and the drain electrode of the integrated circuit device, and growing a thick oxide, often referred to as field oxide (FOX), in an isolation region. This structure causes the threshold voltage in the isolation region much higher than that of the neighboring active devices, making surface inversion not occur under the field oxide region.

The LOCOS (LOCal Oxidation of Silicon) process is used to develop regions which laterally isolate the active devices on the integrated circuits. The LOCOS structure is typically formed by using a pattered silicon nitride layer together with a pad oxide, which is utilized to release stress caused by the silicon nitride layer, underneath to mask the active regions, followed by ion-implantation in the isolation region and then growing a thick field oxide locally. Another structure similar to the LOCOS is the Buffered Polysilicon LOCOS (BPL) isolation process, which uses a sandwich consisting of a pad oxide having thereon a polysilicon layer, and a silicon nitride layer on the polysilicon layer.

Both structures mentioned above possess some inherent drawbacks resulting from the processes, i.e., lateral oxidation of the silicon underneath the silicon nitride mask, making the edge of the field oxide resemble a bird's beak, and the lateral diffusion of channel-stop dopants, making dopants encroaching into the active device regions. Both effects overtake the active device region, making the physical channel width less than the desired channel width. The reduced portion overtaken by both effects will make the situation even worse when devices are scaled down for VLSI implementation, increasing threshold voltage and reducing the current driving capability. Furthermore, p-channel devices and n-channel devices in CMOS process require extra steps strictly to achieve the isolation among the opposite-type devices as well as among the same-type devices.

Several methods in the prior art have been designed for improving LOCOS or BPL isolation processes to minimize the transition regions between active areas. For example, the side wall masked isolation (SWAMI) process has been proposed which involves the addition of a second silicon nitride layer on the side wall. The SWAMI offers basically near-zero bird's beak, but at the expense of process complexity. Another method in the prior an is the sealed-interface local oxidation (SILO) process which uses three layers of a silicon nitride over the silicon substrate followed by an oxide layer and a cap silicon nitride layer. The SILO can reduce the bird's beak, but at the expense of generating more stress, more crystal defects, and higher leakage currents. Also, the buried oxide (BOX) process has been devised which uses an aluminum mask to etch a silicon groove and the subsequent removal of a plasma deposited silicon dioxide layer. The BOX process can reduce the bird's beak but, however, at the expense of manufacture complexity. Although numerous techniques have been devised for improving the LOCOS or the BPL isolation process to minimize bird's beak effect, none of these effectively overcomes the dopant encroachment problems.

SUMMARY OF THE INVENTION

It is therefore a primary object of this invention to provide an improved method for minimizing the encroachment effect of field isolation structures.

It is another object of the invention to provide an improved method of the local oxidation of silicon (LOCOS) and the buffered polysilicon LOCOS (BPL) structures.

It is a further object of the present invention to provide a method for forming the field isolation structure with serf-aligned channel stop regions for NMOS, PMOS and CMOS integrated circuits.

In the process, a sacrificial layer is deposited on a laminate comprising a substrate having thereon stacked layers. A photo-resist mask which defines the active regions is then formed on the top of the sacrificial layer and an anisotropic etching is used to remove the unmasked sacrificial layer and the stacked layers. A portion of the photo-resist is eroded, and the exposed sacrificial layer is removed. After the photo-resist is removed, channel-stop ions are implanted, and the portion of the stacked layers not covered by the sacrificial layer are etched. After the sacrificial layer is completely removed, isolation regions are formed by oxidizing the exposed substrate, and then the stacked layers are removed. The channel-stop region is serf-aligned to the resulting field oxide and the isolation structure is free of the impurity encroachment effect.

DESCRIPTION OF THE PREFERRED EMBODIMENTS

According to the present invention, an improved method is provided to define isolation structures between active regions with minimized impurity encroachment effects, i.e., the lateral diffusion of implanted ions due to oxidation processes during the formation of isolation regions. This technique finds several applications in the processing of silicon wafers for NMOS, PMOS or CMOS integrated circuits.

Figure 1A:
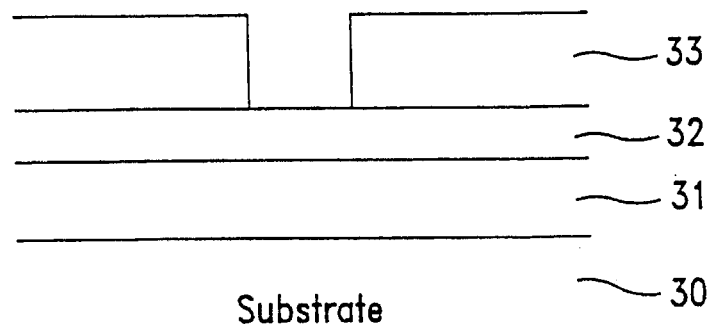
FIGS. 1A to 1F show the steps of the present invention for forming a MOS isolation region.
Figure 1B:
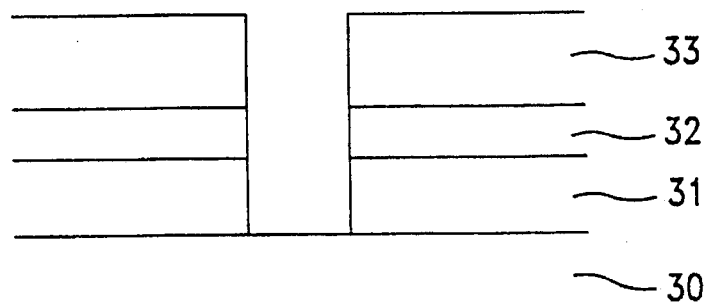

FIGS. 1A to 1F illustrate a preferred embodiment of the present invention. FIG. 1A represents the initial stage wherein a substrate 30 of p-type or n-type has grown thereon the stacked layers 31, which will be used to block ions during the channel stop implantation and be used for the local oxidation. Atop of the stacked layers 31 is a sacrificial layer 32 in thickness of 500~1000 Å, which features in the present invention and is preferably deposited by the low pressure chemical vapor deposition (LPCVD) or the plasma-enhanced chemical vapor deposition (PECVD). Then a photo-resist 33 is used to define the active regions, for example the active regions for n-type devices, and the unmasked portion of the sacrificial layer 32 and the stacked layers 31 are removed anistropically until the substrate 30 is exposed as shown in FIG. 1B.

Figure 1C:
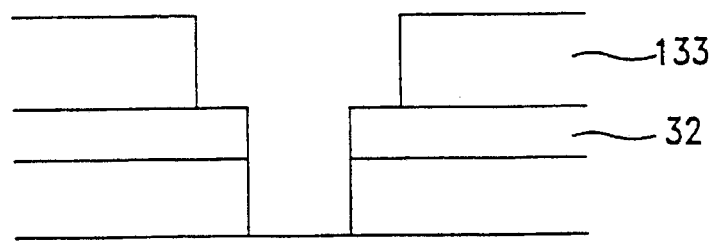

The next step in the process is to perform a photo-resist erosion, exposing a portion of the unremoved sacrificial layer 32. Then, as shown in FIG. 1C, the portion of the sacrificial layer 32 not covered by the eroded photo-resist 133 is etched and the photo-resist mask 133 is removed, resulting in a structure shown in FIG. 1D. Preferably, a dry etching process such as the plasma etching or the reactive ion etching (RIE) is used for providing good selectivity, and the photo-resist mask 133 is removed by a stripping solution such as sulfuric acid.

Figure 1D:
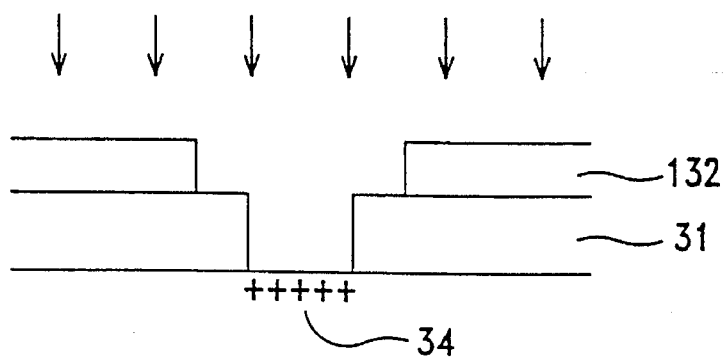
Figure 1E:
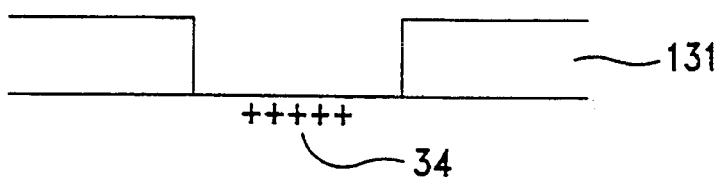
Figure 1F:
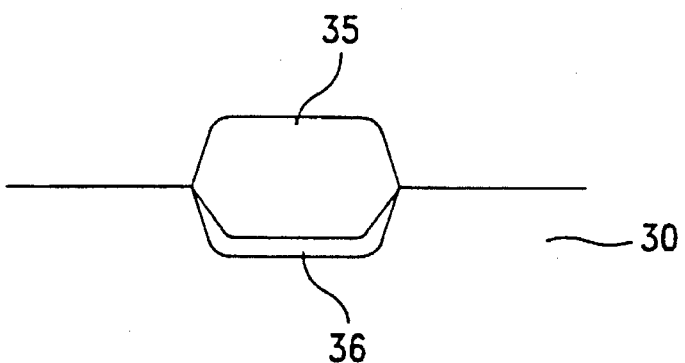

In the next step of the process as depicted in FIG. 1D, the structure is implanted with channel-stopping ions, for example boron dopants 34. After the ion-implantation step, the stacked layers 31 are etched by utilizing the remained sacrificial layer 132 as a mask, and then the sacrificial layer 132 is removed, resulting in a structure as shown in FIG. 1E. Noticeably, the ion-implanted region 34 is offset from the edges of the stacked layer 131 self-alignedly. FIG. 1F shows the step wherein the exposed substrate 30 is oxidized to form a field oxide region 35, which is typically 3000~10000 Å, and a channel stop layer 36 underneath the field oxide region 35 without the implanted-ion encroachment effect. The final step in the process of the present invention is the removal of the stacked layers 131. When the present invention is practiced for p-channel devices, the implanted ions as in FIG. 1D are donors such as phosphorus ions instead of the boron ions.

Figure 2A:
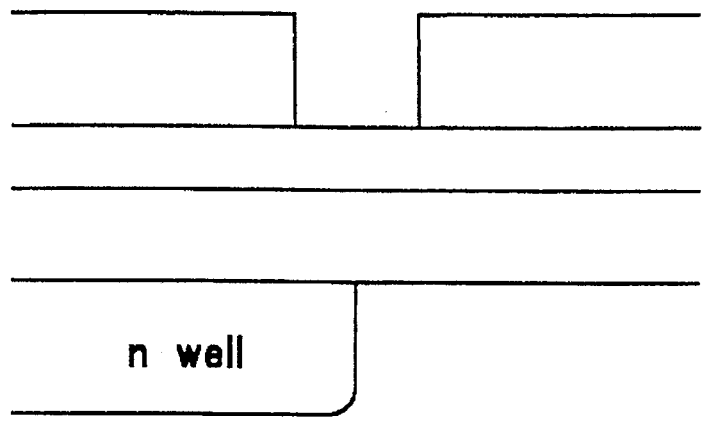
FIGS. 2A to 2I show the steps of the present invention for forming a CMOS isolation region.
Figure 2B:
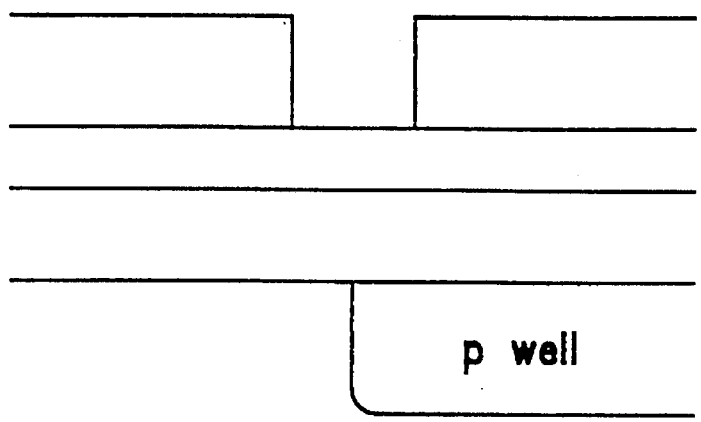
Figure 2C:
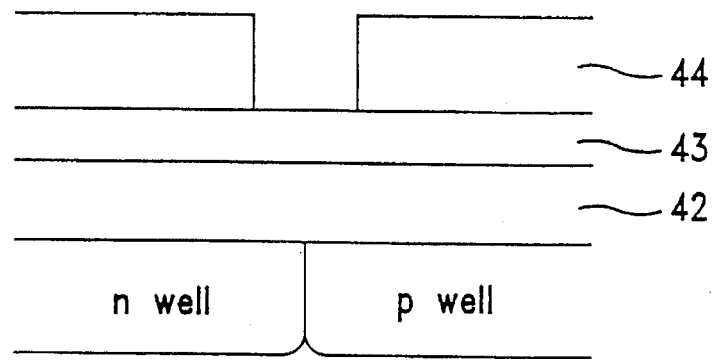
Figure 2D:
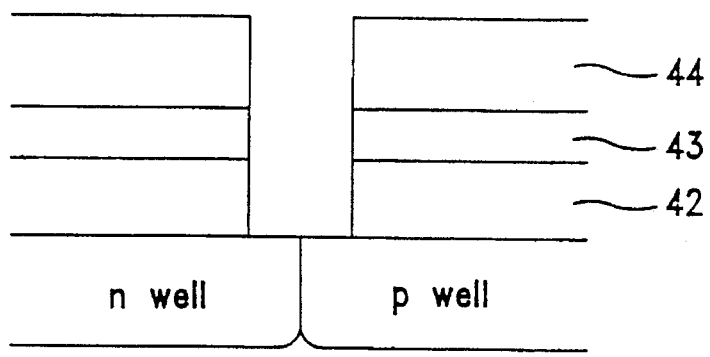

In CMOS technology, both n-type and p-type devices must be made on the same chip, and must be properly isolated. FIGS. 2A to 2I illustrate the application of the present invention to the CMOS isolation process. FIG. 2A to FIG. 2C show three methods for fabricating the n-type and the p-type devices on the same substrate, i.e. the n-well on the p-type substrate as in FIG. 2A, the p-well on the n-type substrate as in FIG. 2B and the twin-well method as in FIG. 2C. For the clarity of the following explanation, the twin-well method is used while it is well understood that the other methods could be applied equally. FIG. 2C represents the initial stage wherein the stacked layers 41 are grown, and will be used to block ions during the channel stop implantation and be used for the local oxidation. Atop of the stacked layers 42 is the sacrificial layer 43, which features in the present invention and is preferably deposited by the low pressure chemical vapor deposition (LPCVD) or the plasma-enhanced chemical vapor deposition (PECVD). Then a photo-resist 44 is used to define the active regions, that is, the active regions for n-type devices and the active regions for p-type devices, and the unmasked portion of the sacrificial layer 43 and the stacked layers 42 are removed anistropically as shown in FIG. 2D.

Figure 2E:
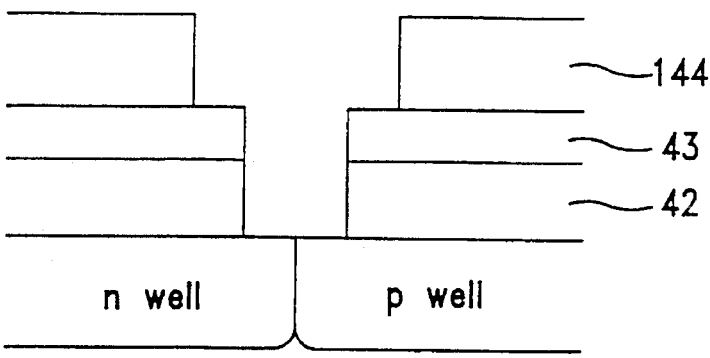

The next step in the process is to perform a photo-resist erosion, exposing a portion of the unremoved sacrificial layer 43. Then, as shown in FIG. 2E, the portion of the sacrificial layer 43 not covered by the eroded photo-resist 144 is etched and the photo-resist mask 144 is removed, resulting in a structure shown in FIG. 2F. Preferably, a dry etching process such as the plasma etching or the reactive ion etching (RIE) is used for providing good selectivity, and the photo-resist mask 144 is removed by a stripping solution such as sulfuric acid.

Figure 2F:
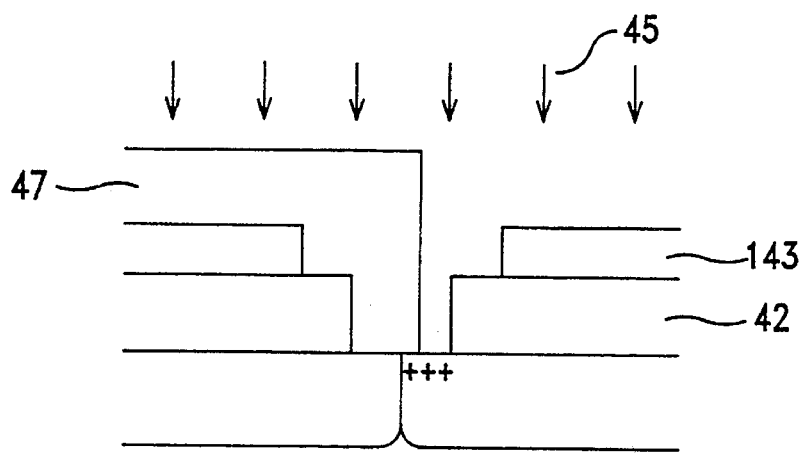
Figure 2G:
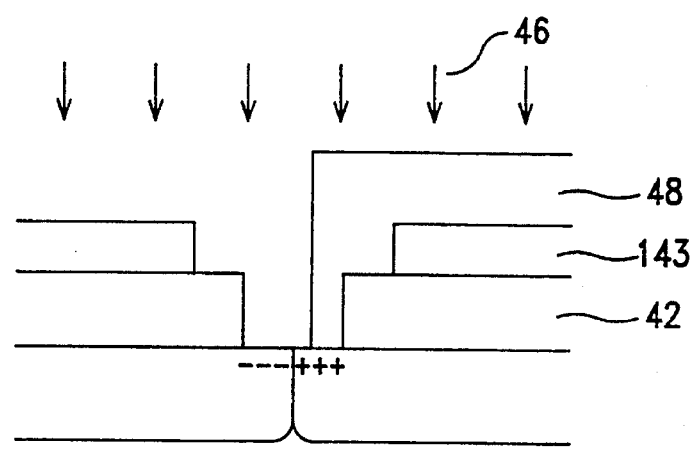

In the next step of the process, depicted in FIG. 2F, the active regions of the p-type devices are masked, and the mask 47 is removed after the ions 45, for example boron dopants 34, of the p-type are implanted. Then the active regions of the n-type devices are masked as depicted in FIG. 2G, ions 46, for example phosphorus dopants 46, of the n-type are implanted, and the mask 48 is then removed. Because the pile-up effect of the n-type impurity during oxidation will increase impurity profiles in silicon, the step described in FIG. 2G is usually omitted except for fabricating high voltage devices.

Figure 2H:
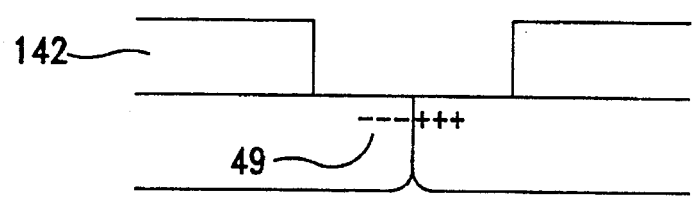

After the ion-implantation steps, the stacked layers 42 are etched by utilizing the remained sacrificial layer 143 as a mask, and then the sacrificial layer 143 is removed, resulting in a structure as shown in FIG. 2H. Noticeably, the ion-implanted region 49 is offset from the edges of the stacked layer 142 self-alignedly.

Figure 2I:
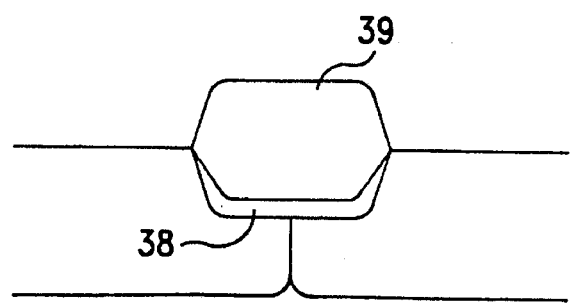

FIG. 2I shows the step wherein the structure of FIG. 2H is oxidized to form a field oxide region 39, which is typically 3000~10000 Å, and a channel stop layer 38 underneath the field oxide region 39 without the implanted-ion encroachment effect. The final step in the process of the present invention is the removal of the stacked layers 142.

Figure 3A:
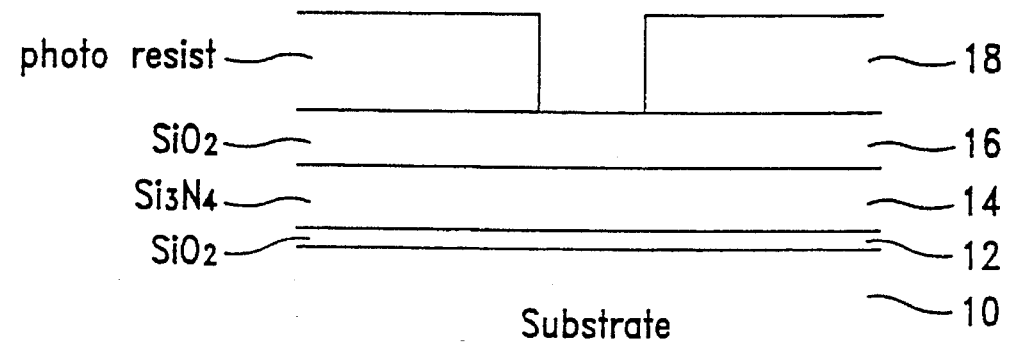
FIGS. 3A to 3F show the steps of the present invention for forming a MOS isolation region for the LOCOS structure.

FIGS. 3A to 3F show another preferred embodiment of the present invention for forming isolation regions of the LOCal Oxidation of Silicon (LOCOS) structure. FIG. 3A represents the initial stage of the process. A silicon substrate 10 of p-type or n-type has grown thereon a silicon dioxide ($SiO_2$) 12, which is typically 300~600 Å and is often referred to as the pad oxide or the stress-relief oxide (SRO). Atop of the pad oxide is a layer of silicon nitride ($Si_3N_4$) 14 which is typically 1000~2000 Å and is preferably deposited by the low pressure chemical vapor deposition (LPCVD) or the plasma-enhanced chemical vapor deposition (PECVD). The pad oxide 12 and the silicon nitride 14 together form stacked layers to block ions during the channel stop implantation and the local oxidation in the steps described hereinafter. Then a sacrificial layer 16, which is preferably a silicon dioxide layer in thickness of 500~1000 Å, is deposited on the silicon nitride layer 14 preferably by LPCVD or PECVD. Atop the sacrificial layer 16 is a photo-resist mask 18, which is used to define active regions. The thickness of the silicon nitride layer 14 depends on that of the pad oxide 12, and the thickness ratio of the former to the latter is about 3.

Figure 3B:
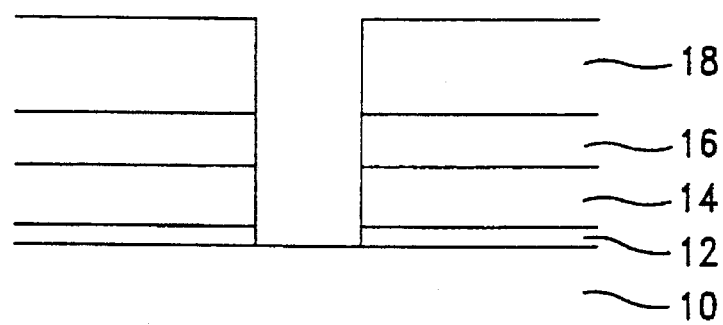
Figure 3C:
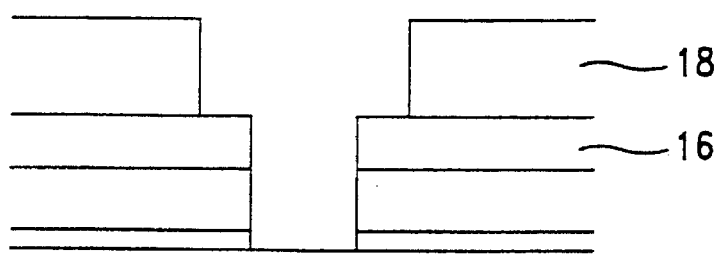

FIG. 3B shows the structure after the unmasked portion of the sacrificial layer 16, the stacked layers 14, 12 are removed anistropically until the substrate 10 is exposed. The next step in the process is to perform a photo-resist erosion, exposing a portion of the unremoved sacrificial layer 16, as shown in FIG. 3C. Then, the portion of the sacrificial layer 16 not covered by the eroded photo-resist mask 118 is etched and the photo-resist mask 118 is removed, resulting in a structure shown in FIG. 3D. Preferably, a dry etching process such as the plasma etching or the reactive ion etching (RIE) is used for providing good selectivity, and the photo-resist mask 118 is removed by a stripping solution such as sulfuric acid.

Figure 3D:
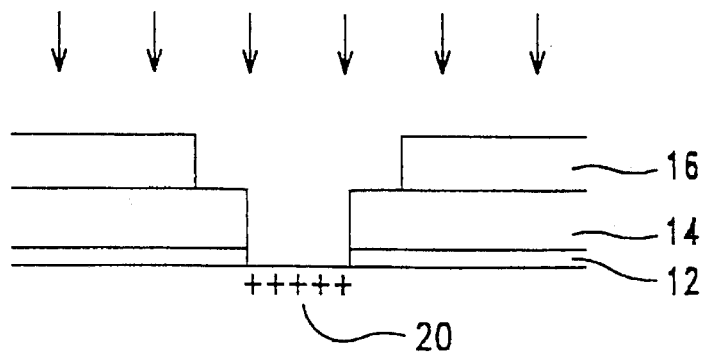
Figure 3E:
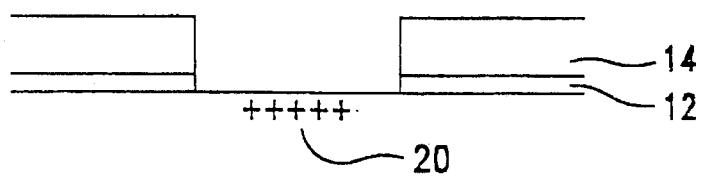
Figure 3F:
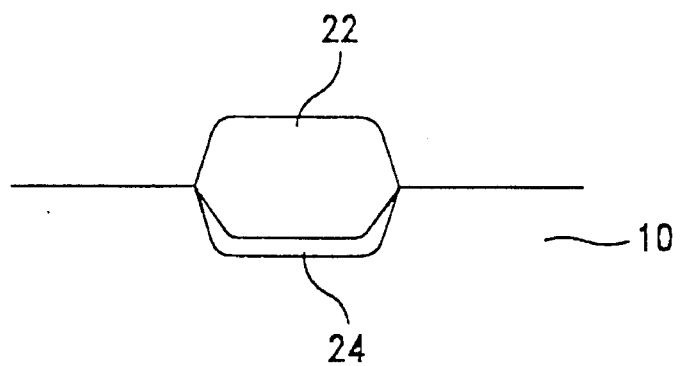

In the next step of the process as depicted in FIG. 3D, the structure is implanted with channel-stopping ions, for example boron dopants 20. After the ion-implantation step, the stacked layers, i.e., the silicon nitride 14 and the pad oxide 12, are etched by utilizing the remained sacrificial layer 116 as a mask, and then the sacrificial layer 116 is removed, resulting in a structure as shown in FIG. 3E. Noticeably, the ion-implanted region 20 is offset from the edges of the stacked layer 12, 14 self-alignedly. FIG. 3F shows the step wherein the exposed substrate 10 is oxidized to form a field oxide region 22, which is typically 3000~10000 Å, and a channel stop layer 24 underneath the field oxide region 22 without the implanted-ion encroachment effect. The final step in the process is the removal of the silicon nitride layer 114 and the pad oxide layer 112. The former is removed by using boiling phosphoric acid at a temperature of about 180° C. and the latter with a hydrofluoric acid stripping solution. When the present invention is practiced for p-channel devices, the implanted ions as in FIG. 3D are donors such as phosphorus ions instead of the boron ions.

Figure 4A:
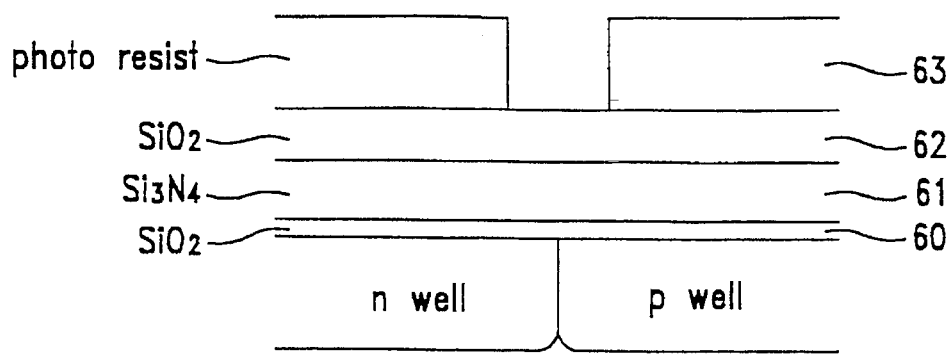
FIGS. 4A to 4G show the steps of the present invention for forming a CMOS isolation region for the LOCOS structure.
Figure 4B:
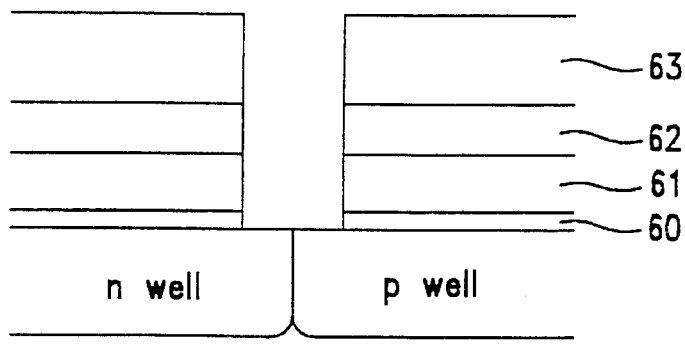

FIGS. 4A to 4I illustrate the application of the present invention to the CMOS process for forming isolation regions of the local oxidation of silicon (LOCOS) structure. For the same reason of the FIGS. 2's, the twin-well method is used while it is well understood that the other methods could be applied equally. FIG. 4A represents the initial stage wherein the pad oxide layer 60 is grown and the silicon nitride layer 61 is deposited, which together will be used to block ions during the channel stop implantation and be used for the local oxidation described hereinafter. Atop of the silicon nitride layer 61 is the sacrificial layer 62, which features in the present invention and is preferably a silicon oxide layer deposited by the low pressure chemical vapor deposition (LPCVD) or the plasma-enhanced chemical vapor deposition (PECVD). Then a photo-resist 63 is used to define the active regions, that is, the active regions for n-type devices and the active regions for p-type devices, and the unmasked portion of the sacrificial layer 62, the silicon nitride layer 61 and the pad oxide 60 are removed anistropically as shown in FIG. 4B.

Figure 4C:
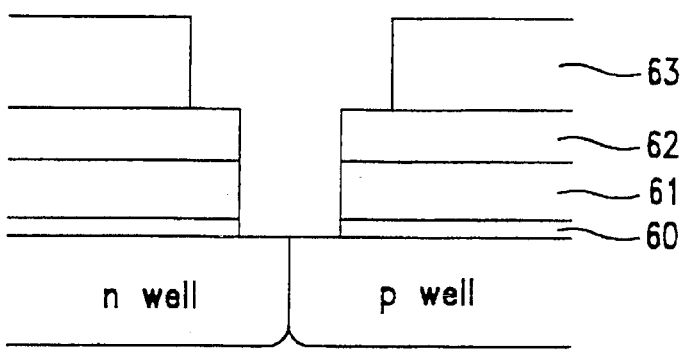

The next step in the process is to perform a photo-resist erosion, exposing a portion of the unremoved sacrificial layer 62. Then, as shown in FIG. 4C, the portion of the sacrificial layer 62 not covered by the eroded photo-resist mask 163 is etched and the photo-resist mask 163 is removed, resulting in a structure shown in FIG. 4D. Preferably, a dry etching process such as the plasma etching or the reactive ion etching (RIE) is used for providing good selectivity, and the photo-resist mask 163 is removed by a stripping solution such as sulfuric acid.

Figure 4D:
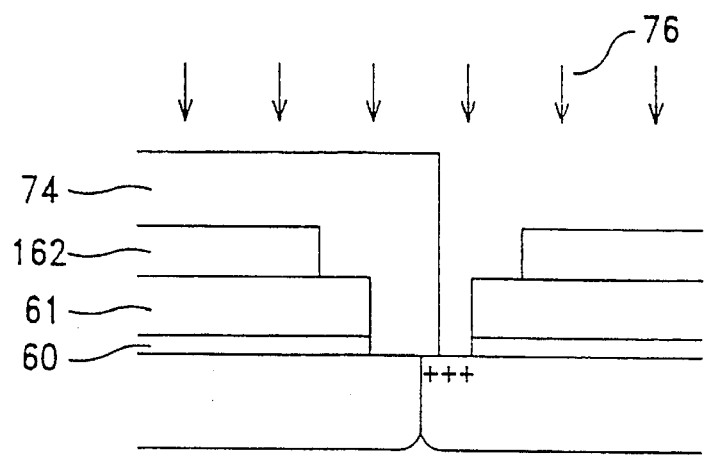
Figure 4E:
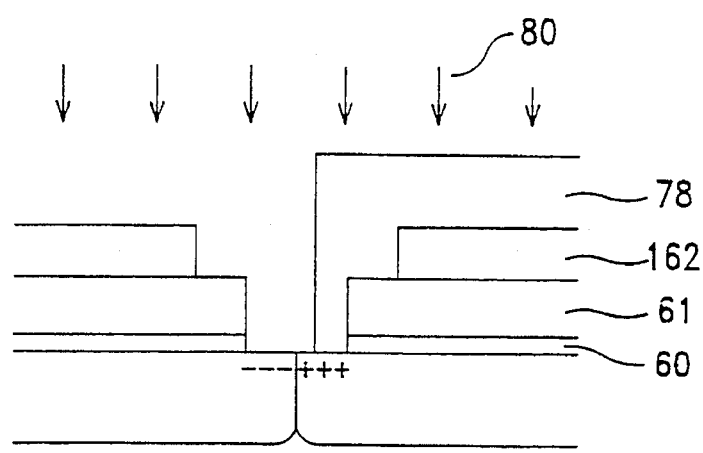

In the next step of the process, depicted in FIG. 4D, the active regions of the p-type devices are masked, and the mask 74 is removed after the ions 76, for example boron dopants, of the p-type are implanted. Then the active regions of the n-type devices are masked as depicted in FIG. 4E, ions 80, for example phosphorus dopants, of the n-type are implanted, and the mask 78 is then removed. Because the pile-up effect of the n-type impurity during oxidation will increase impurity profiles in silicon, the step described in FIG. 4E is usually omitted except for fabricating high voltage devices.

Figure 4F:
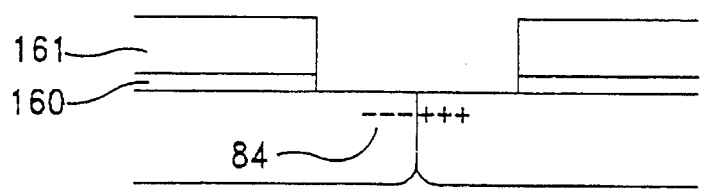
Figure 4G:
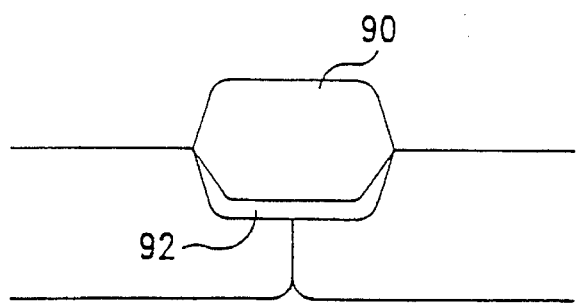

After the ion-implantation steps, the pad oxide 60 and the silicon nitride layer 61 are etched by utilizing the remained sacrificial layer 162 as a mask, and then the sacrificial layer 162 is removed, resulting in a structure as shown in FIG. 4F. Noticeably, the ion-implanted region 84 is offs6et from the edges of the pad oxide 160 and the silicon nitride layer 161 self-alignedly. FIG. 4G shows the step wherein the structure of FIG. 4F is oxidized to form a field oxide region 90, which is typically 3000~10000 Å, and a channel stop layer 92 underneath the field oxide region 90 without the implanted-ion encroachment effect. The final step in the process is the removal of the silicon nitride layer 161 and the pad oxide layer 160.

Figure 5A:
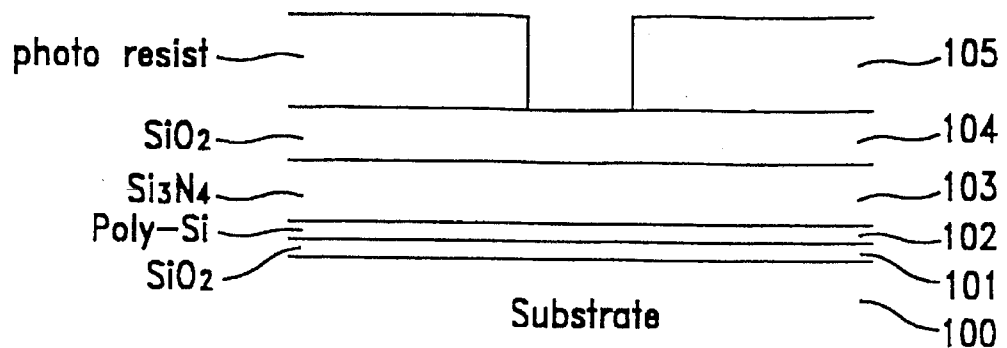
FIGS. 5A to 5F show the steps of the present invention for forming a MOS isolation region for the BPL structure.

FIGS. 5A to 5F show another preferred embodiment of the present invention for forming isolation regions of the Buffered Polysilicon LOCOS (BPL) structure. FIG. 5A represents the initial stage of the process. A silicon substrate 100 of p-type or n-type has grown thereon a silicon dioxide ($SiO_2$) 101, which is typically 100~300 Å and is often referred to as the pad oxide or the stress-relief oxide (SRO). Atop of the the pad oxide 101 is a layer of polysilicon 102, which is typically 250~400 Å. Atop of the policilicon layer 102 is a layer of silicon nitride ($Si_3N_4$) 103 which is preferably deposited by the low pressure chemical vapor deposition (LPCVD) or the plasma-enhanced chemical vapor deposition (PECVD), and is typically 1000~2000 Å. The pad oxide 101, the policilicon layer 102 and the silicon nitride layer 103 together form stacked layers to block ions during the channel stop implantation and the local oxidation in the steps described hereinafter. Then a sacrificial layer 104, which is preferably a silicon dioxide layer in thickness of 5000~1000 Å, is deposited on the silicon nitride layer 103 preferably by LPCVD or PECVD. Atop the sacrificial layer 104 is a photo-resist mask 105, which is used to define active regions.

Figure 5B:
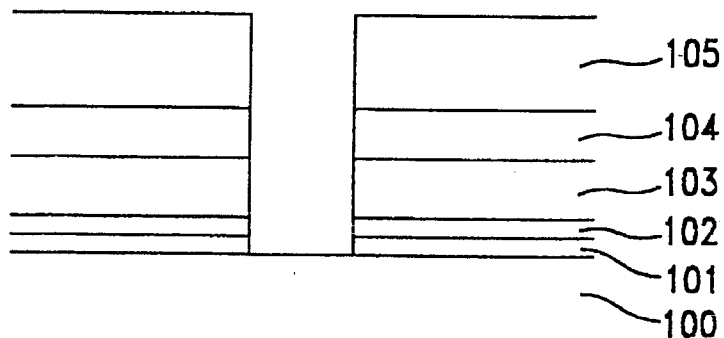
Figure 5C:
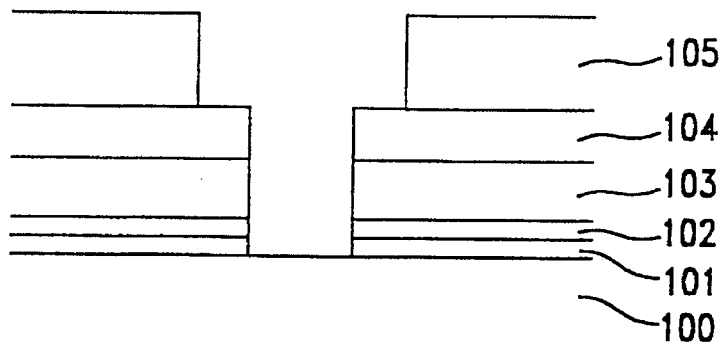

FIG. 5B shows the structure after the unmasked portion of the sacrificial layer 104, the stacked layers 103, 102 and 101 are removed anistropically until the substrate 100 is exposed. The next step in the process is to perform a photo-resist erosion, exposing a portion of the unremoved sacrificial layer 104. Then, as shown in FIG. 5C, the portion of the sacrificial layer 104 not covered by the eroded photo-resist mask 1105 is etched and the photo-resist mask 1105 is removed, resulting in a structure shown in FIG. 5D. Preferably, a dry etching process such as the plasma etching or the reactive ion etching (RIE) is used for providing good selectivity, and the photo-resist mask 1105 is removed by a stripping solution such as sulfuric acid.

Figure 5D:
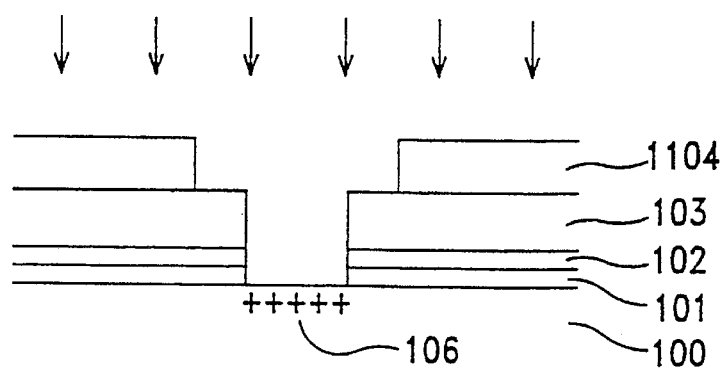
Figure 5E:
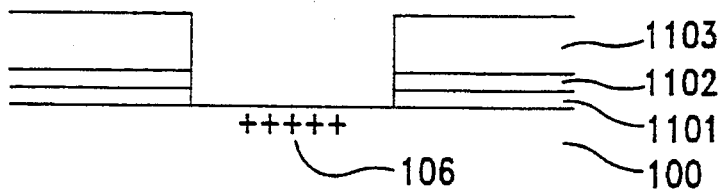
Figure 5F:
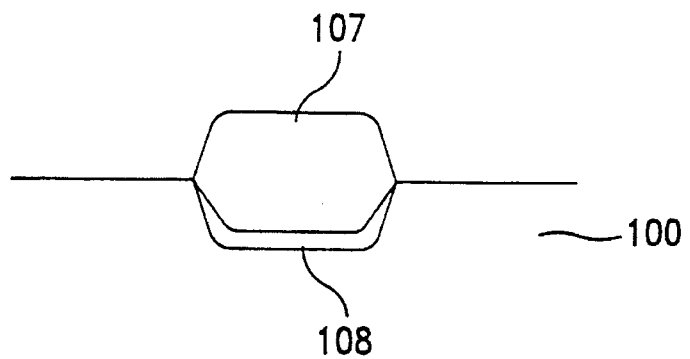

In the next step of the process as depicted in FIG. 5D, the structure is implanted with channel-stopping ions, for example boron dopants 106. After the ion-implantation step, the stacked layers, i.e., the silicon nitride layer 103, the polysilicon layer 102, and the pad oxide 101, are etched by utilizing the remained sacrificial layer 1104 as a mask, and then the sacrificial layer 1104 is removed, resulting in a structure as shown in FIG. 5E. Noticeably, the ion-implanted region 106 is offset from the edges of the stacked layers 1103, 1102 and 1101 self-alignedly. FIG. 5F shows the step wherein the exposed substrate 100 is oxidized to form a field oxide region 107, which is typically 3000~10000 Å, and a channel stop layer 108 underneath the field oxide region 107 without the implanted-ion encroachment effect. The final step in the process is the removal of the silicon nitride layer 1103, the polysilicon layer 1102 and the pad oxide 1101. When the present invention is practiced for p-channel devices, the implanted ions as in FIG. 5D are donors such as phosphorus ions instead of the boron ions.

Figure 6A:
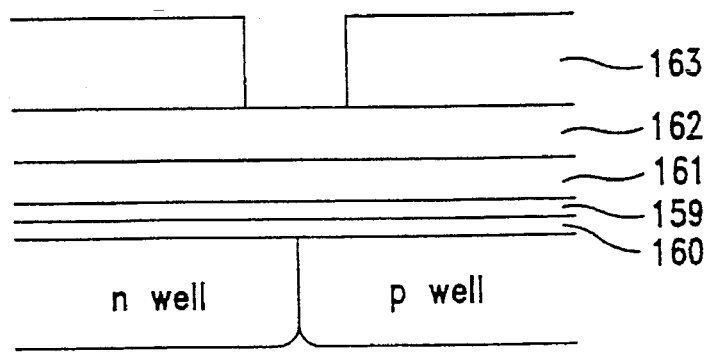
FIGS. 6A to 6G show the steps of the present invention for forming a CMOS isolation region for the BPL structure.
Figure 6B:
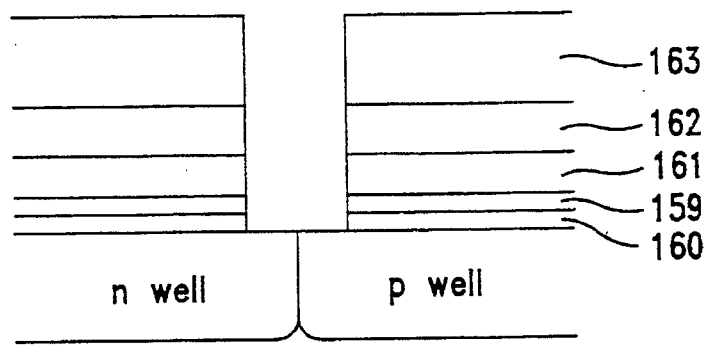

FIGS. 6A to 6I illustrate the application of the present invention to the CMOS process for forming isolation regions of the Buffered Polysilicon LOCOS (BPL)structure. For the same reason of the FIGS. 2's, the twin-well method is used while it is well understood that the other methods could be applied equally. FIG. 6A represents the initial stage wherein the pad oxide 160 is grown, the polysilicon layer 159 is deposited, and the silicon nitride layer 161 is deposited, which together will be used to block ions during the channel stop implantation and be used for the local oxidation described hereinafter. Atop of the silicon nitride layer 161 is the sacrificial layer 162, which features in the present invention and is preferably a silicon oxide layer deposited by the low pressure chemical vapor deposition (LPCVD) or the plasma-enhanced chemical vapor deposition (PECVD). Then a photo-resist 163 is used to define the active regions, that is, the active regions for n-type devices and the active regions for p-type devices, and the unmasked portion of the sacrificial layer 162, the silicon nitride layer 161, the polysilicon layer 159 and the pad oxide 160 are removed anistropically as shown in FIG. 6B.

Figure 6C:
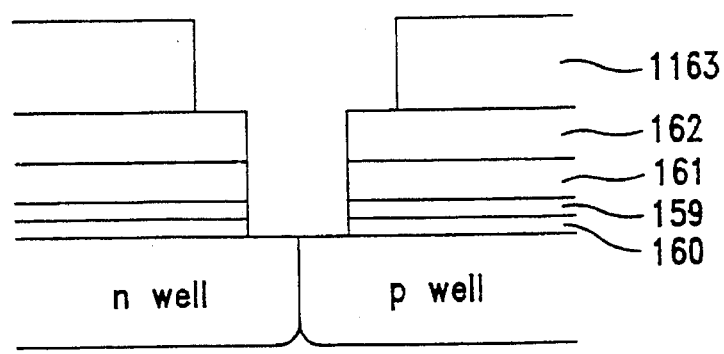

The next step in the process is to perform a photo-resist erosion, exposing a portion of the unremoved sacrificial layer 162. Then, as shown in FIG. 6C, the portion of the sacrificial layer 162 not covered by the eroded photo-resist mask 1163 is etched and the photo-resist mask 1163 is removed, resulting in a structure shown in FIG. 6D. Preferably, a dry etching process such as the plasma etching or the reactive ion etching (RIE) is used for providing good selectivity, and the photo-resist mask 1163 is removed by a stripping solution such as sulfuric acid.

Figure 6D:
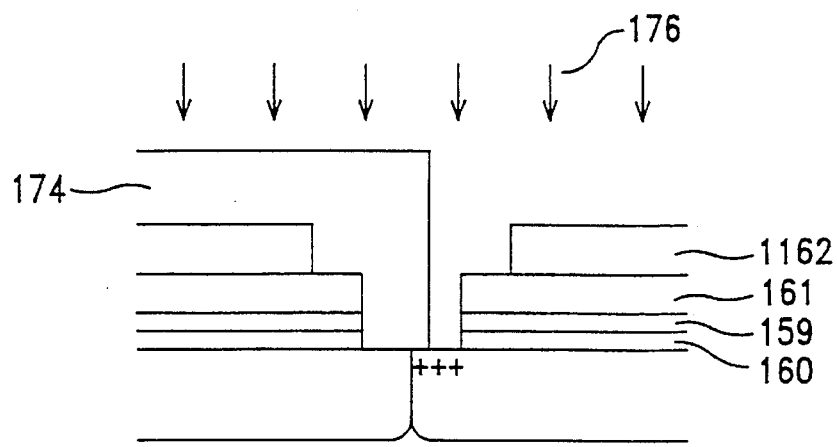
Figure 6E:
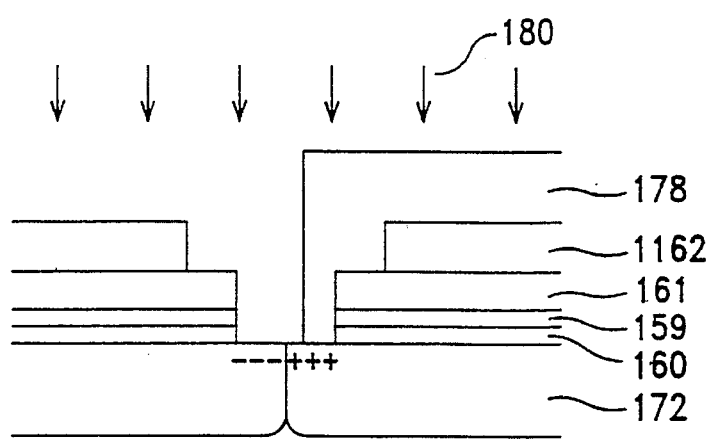

In the next step of the process, depicted in FIG. 6D, the active regions of the p-type devices are masked, and the mask 174 is removed after the ions 176, for example boron dopants, of the p-type are implanted. Then the active regions of the n-type devices are masked as depicted in FIG. 6E, ions 180, for example phosphorus dopants, of the n-type are implanted, and the mask 178 is then removed. Because the pile-up effect of the n-type impurity during oxidation will increase impurity profiles in silicon, the step described in FIG. 6E is usually omitted except for fabricating high voltage devices.

Figure 6F:
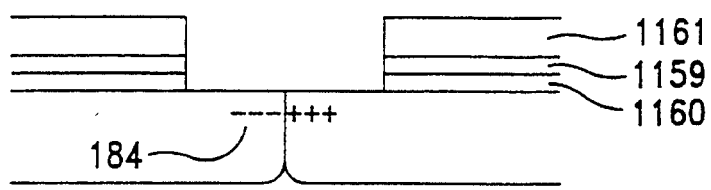
Figure 6G:
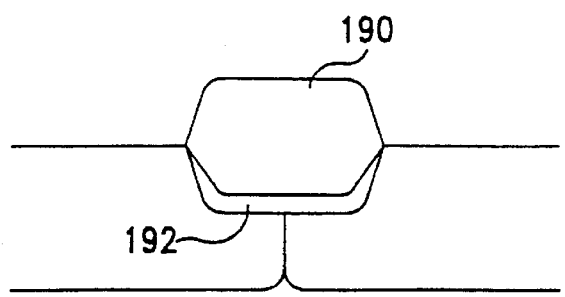

After the ion-implantation steps, the pad oxide 160, the polysilicon layer 159 and the silicon nitride layer 161 are etched by utilizing the remained sacrificial layer 1162 as a mask, and then the sacrificial layer 1162 is removed, resulting in a structure as shown in FIG. 6F. Noticeably, the ion-implanted region 184 is offset from the edges of the stacked layers of the pad oxide 1160, the polysilicon layer 1159 and the silicon nitride layer 1161 self-alignedly. FIG. 6G shows the step wherein the structure of FIG. 6F is oxidized to form a field oxide region 190, which is typically 3000~10000 Å, and a channel stop layer 192 underneath the field oxide region 190 without the implanted-ion encroachment effect. The final step in the process is the removal of the silicon nitride layer 1161, the polysilicon layer 1159 and the pad oxide 1160.

Although specific embodiments have been illustrated and described, it will be obvious to those skilled in the art that various modification may be made without departing from the spirit which is intended to be limited solely by the appended claims.

What is claimed is:

1. A process for forming isolation regions on a semiconductor substrate, which comprises:

depositing a sacrificial layer on a laminate comprising the substrate having thereon stacked layers;

defining active regions of a first type by means of a photo-resist mask on the sacrificial layer, and removing the unmasked sacrificial layer and the unmasked stacked layers anistropically;

performing a photo-resist erosion process for exposing a portion of the unremoved sacrificial layer;

etching the sacrificial layer to completely remove the portion thereof not covered by the photo-resist mask;

removing the photo-resist mask from the top of the sacrificial layer;

implanting channel-stopping ions of a second type into the substrate;

etching the stacked layers to completely remove the portion thereof not covered by the sacrificial layer and expose the surface of the substrate;

removing the sacrificial layer from the top of the stacked layers; and oxidizing the exposed substrate so as to form the isolation regions.

2. The process according to claim 1, wherein said sacrificial layer is a silicon oxide layer deposited by low pressure chemical vapor deposition or plasma enhanced chemical vapor deposition.

3. The process according to claim 2, wherein the thickness of the silicon oxide layer is about 500 Å~1000 Å.

4. The process according to claim 1 wherein, after the oxidizing step which forms the isolation regions, the stacked layers are removed.

5. The process according to claim 1, wherein said stacked layers comprises a pad oxide and a silicon nitride layer on the pad oxide.

6. The process according to claim 1, wherein said stacked layers comprises a pad oxide, a polysilicon layer on the pad oxide, and a silicon nitride layer on the polysilicon layer.

7. The process according to claim 1, wherein said substrate is of p-type and said implanted ions are of p-type.

8. The process according to claim 1, wherein said substrate is of n-type and said implanted ions are of n-type.

9. The process according to claim 1, wherein said substrate comprises n-type regions and p-type regions.

10. The process according to claim 9, wherein said substrate is of n-type or of p-type.

11. The process according to claim 10 wherein, after the step for removing the photo-resist mask and before the step for implanting ions of the second type, active regions of the second type are masked, and the mask is removed after the ions of the second type are implanted.

12. The process according to claim 11 wherein, after said ions of the second type are implanted, active regions of the first type are masked, and the mask is removed after the ions of the first type are implanted.

13. A process for forming isolation regions on a semiconductor substrate, which comprises:

depositing a sacrificial layer on a laminate comprising the substrate having thereon a pad oxide, and a silicon nitride layer on the pad oxide;

defining active regions of a first type by means of a photo-resist mask on the sacrificial layer, and removing the unmasked sacrificial layer, the unmasked pad oxide and the unmasked silicon nitride layers anistropically;

performing a photo-resist erosion process for exposing a portion of the unremoved sacrificial layer;

etching the sacrificial layer to completely remove the portion thereof not covered by the photo-resist mask;

removing the photo-resist mask from the top of the sacrificial layer;

implanting channel-stopping ions of a second type into the substrate;

etching the silicon nitride layer and the pad oxide to completely remove the portion thereof not covered by the sacrificial layer and expose the surface of the substrate;

removing the sacrificial layer from the top of the silicon nitride layer; and oxidizing the exposed substrate so as to form the isolation regions.

14. The process according to claim 13, wherein said sacrificial layer is a silicon oxide layer deposited by low pressure chemical vapor deposition or plasma enhanced chemical vapor deposition.

15. The process according to claim 14, wherein the thickness of the silicon oxide layer is about 500 Å~1000 Å.

16. The process according to claim 13 wherein, after the oxidizing step which forms the isolation regions, the pad oxide and the silicon nitride layer are removed.

17. The process according to claim 13, wherein the thickness of the pad oxide is about 300 Å~600 Å.

18. The process according to claim 13, wherein the thickness of the silicon nitride layer is about 1000 Å~2000 Å.

19. The process according to claim 13, wherein said substrate is of p-type and said implanted ions are of p-type.

20. The process according to claim 13, wherein said substrate is of n-type and said implanted ions are of n-type.

21. The process according to claim 13, wherein said substrate comprises n-type regions and p-type regions.

22. The process according to claim 21, wherein said substrate is of n-type or of p-type.

23. The process according to claim 22 wherein after the step for removing the photo-resist mask and before the step for implanting ions of the second type, active regions of the second type are masked, and the mask is removed after the ions of the second type are implanted.

24. The process according to claim 23 wherein, after said ions of the second type are implanted, active regions of the first type are masked, and the mask is removed after the ions of the first type are implanted.

25. A process for forming isolation regions on a semiconductor substrate, which comprises:

depositing a sacrificial layer on a laminate comprising the substrate having thereon a pad oxide, a polysilicon layer on the pad oxide, and a silicon nitride layer on the polysilicon layer;

defining active regions of a first type by means of a photo-resist mask on the sacrificial layer, and removing the unmasked sacrificial layer, the unmasked silicon nitride layer and the unmasked pad oxide anistropically;

performing a photo-resist erosion process for exposing a portion of the unremoved sacrificial layer;

etching the sacrificial layer to completely remove the portion thereof not covered by the photo-resist mask;

removing the photo-resist mask from the top of the sacrificial layer;

implanting channel-stopping ions of a second type into the substrate;

etching the silicon nitride layer, the polysilicon layer and the pad oxide to completely remove the portion thereof not covered by the sacrificial layer and expose the surface of the substrate;

removing the sacrificial layer from the top of the silicon nitride layer; and oxidizing the exposed substrate so as to form the isolation regions.

26. The process according to claim 25, wherein said sacrificial layer is a silicon oxide layer deposited by low pressure chemical vapor deposition or plasma enhanced chemical vapor deposition.

27. The process according to claim 26, wherein the thickness of the silicon oxide layer is about 500 Å~1000 Å.

28. The process according to claim 25 wherein, after the oxidizing step which forms the isolation regions, the silicon nitride layer, the polysilicon layer and the pad oxide are removed.

29. The process according to claim 25, wherein the thickness of the pad oxide layer is about 100 Å~300 Å.

30. The process according to claim 25, wherein the thickness of the polysilicon layer is about 250 Å~400 Å.

31. The process according to claim 25, wherein the thickness of the silicon nitride layer is about 1000 Å~2000 Å.

32. The process according to claim 25, wherein said substrate is of p-type and said implanted ions are of p-type.

33. The process according to claim 25, wherein said substrate is of n-type and said implanted ions are of n-type.

34. The process according to claim 25, wherein said substrate comprises n-type regions and p-type regions.

35. The process according to claim 34, wherein said substrate is of n-type or of p-type.

36. The process according to claim 35 wherein, after the step for removing the photo-resist mask and before the step for implanting ions of the second type, active regions of the second type are masked, and the mask is removed after the ions of the second type are implanted.

37. The process according to claim 36 wherein, after said ions of the second type are implanted, active regions of the first type are masked, and the mask is removed after the ions of the first type are implanted.

* * * * *